United States Patent
Bomer

(10) Patent No.: US 10,694,631 B2
(45) Date of Patent: Jun. 23, 2020

(54) MAGNETIC ACCESS PANEL

(71) Applicant: NEXUS TECHNOLOGIES, INC., Fletcher, NC (US)

(72) Inventor: Benjamin W. Bomer, Swannanoa, NC (US)

(73) Assignee: NEXUS TECHNOLOGIES, INC., Fletcher, NC (US)

(*) Notice: Subject to any disclaimer, the term of this patent is extended or adjusted under 35 U.S.C. 154(b) by 0 days.

(21) Appl. No.: 16/139,425

(22) Filed: Sep. 24, 2018

(65) Prior Publication Data

US 2019/0098781 A1 Mar. 28, 2019

Related U.S. Application Data

(60) Provisional application No. 62/562,831, filed on Sep. 25, 2017.

(51) Int. Cl.
| | |
|---|---|
| *H05K 1/02* | (2006.01) |
| *H05K 5/02* | (2006.01) |
| *A45C 5/06* | (2006.01) |
| *A45C 13/00* | (2006.01) |
| *A45C 13/10* | (2006.01) |
| *A45C 15/00* | (2006.01) |

(52) U.S. Cl.
CPC ............ *H05K 5/0221* (2013.01); *A45C 5/06* (2013.01); *A45C 13/008* (2013.01); *A45C 13/1069* (2013.01); *H05K 5/0239* (2013.01); *A45C 15/00* (2013.01)

(58) Field of Classification Search
CPC .......... H02K 15/03; H02K 1/28; H02K 1/276; H02K 5/04; A45C 2011/002; A45C 11/00; A45C 2011/003; A45C 13/001; A45C 13/002; A45C 13/008; A45C 13/1069; A45C 13/1076; A45C 15/00; A45C 5/06; H05K 5/0239; H05K 5/0004; H05K 5/02; H05K 5/0217; H05K 5/0226; H05K 5/03; H05K 5/0221
See application file for complete search history.

(56) References Cited

U.S. PATENT DOCUMENTS 5,226,540 A * 7/1993 Bradbury .............. G06F 1/1628
 206/320
8,884,730 B2 * 11/2014 Lauder ..................... H01F 7/04
 206/320

(Continued)

FOREIGN PATENT DOCUMENTS

WO 2017079707 A1 5/2017

OTHER PUBLICATIONS

International Search Report dated Dec. 10, 2018 in corresponding International Application No. PCT/IB2018/057363 filed Sep. 24, 2018.

*Primary Examiner* — James Wu
(74) *Attorney, Agent, or Firm* — Womble Bond Dickinson (US) LLP

(57) ABSTRACT

An access panel having a magnetic clasp, hingedly joined to an enclosure surface, especially an enclosure housing electronic components. The access panel can removably cover electronic utilities, such as sockets, ports, controls, and the like, and seal out moisture and debris. In various implementations, the access panel is secured against the enclosure surface magnetically.

19 Claims, 3 Drawing Sheets

(56) References Cited

U.S. PATENT DOCUMENTS

| | | | |
|---|---|---|---|
| 2003/0178114 A1* | 9/2003 | Enlow | G06F 1/1607 |
| | | | 150/107 |
| 2004/0045129 A1* | 3/2004 | Tamehira | E05D 11/1064 |
| | | | 16/223 |
| 2005/0274782 A1* | 12/2005 | Petrelli | B65D 5/745 |
| | | | 229/217 |
| 2009/0250949 A1 | 10/2009 | Sharpe | |
| 2014/0265781 A1* | 9/2014 | Rader | E05D 1/00 |
| | | | 312/319.2 |
| 2015/0326044 A1* | 11/2015 | Ashley | H02J 7/0054 |
| | | | 320/103 |
| 2017/0127776 A1* | 5/2017 | Korey | A45C 5/03 |
| 2017/0127783 A1* | 5/2017 | Korey | A45C 5/03 |
| 2017/0156462 A1 | 6/2017 | Yu | |

* cited by examiner

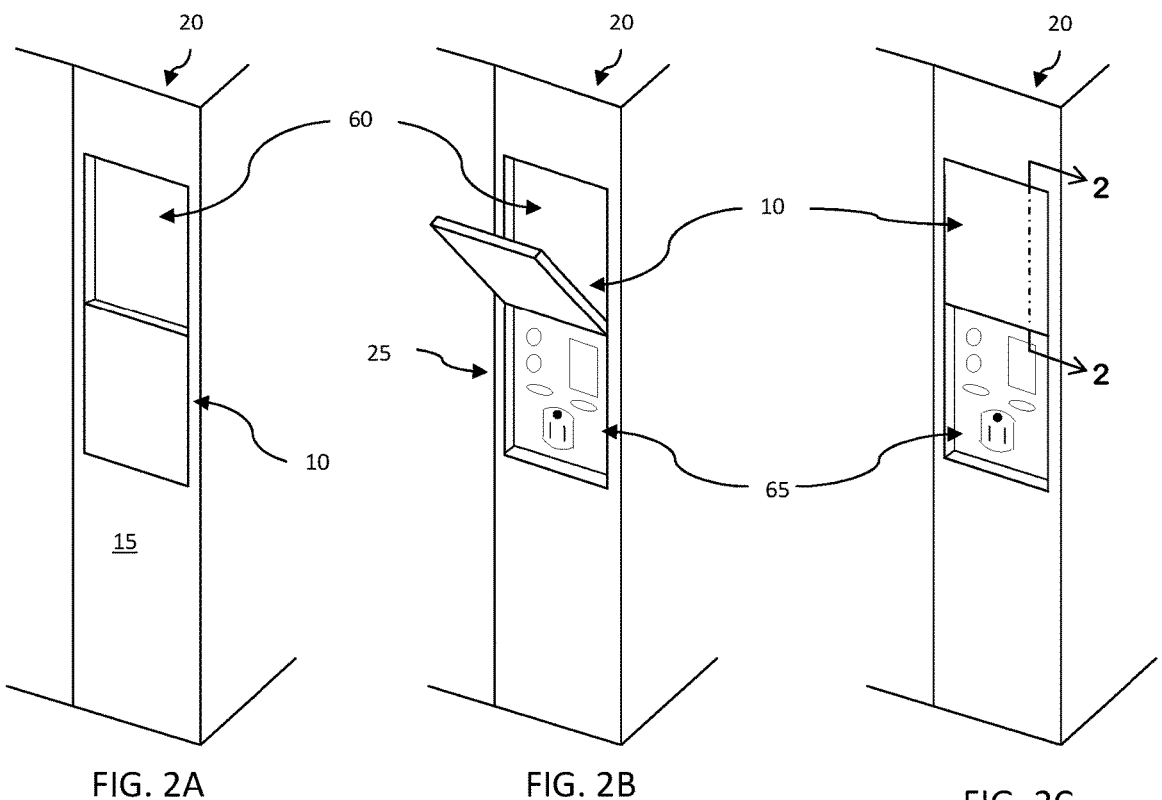
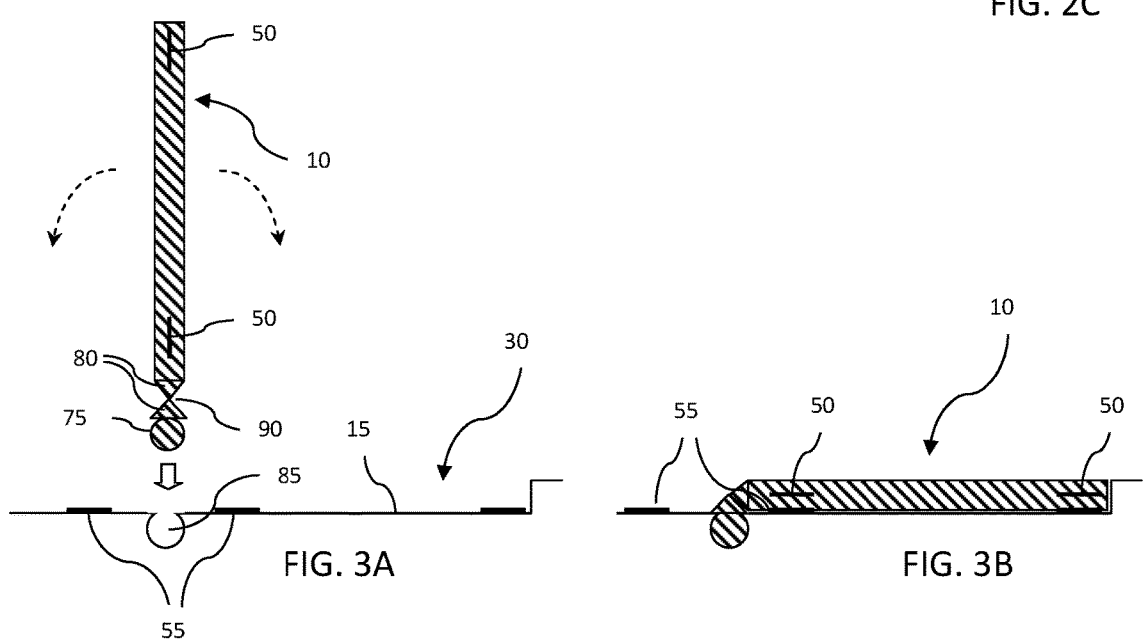

MAGNETIC ACCESS PANEL

CROSS-REFERENCE TO RELATED APPLICATION

The present application claims priority to U.S. Provisional Patent Application No. 62/562,831, entitled: Magnetic Access Panel, filed on Sep. 25, 2017, the content of which is incorporated herein by reference.

TECHNOLOGICAL FIELD

The present subject matter relates broadly to access panels, and more specifically to an access panel with a magnetic clasp.

BACKGROUND

Access panels of various sorts are a common feature of housings containing mechanical and electronic works, controls, instruments, and the like. Such panels allow persons to gain easy entry into the housing interior without having to remove or dismantle the housing or other components. Access doors also act to protect interior elements from moisture, dust, debris, and mechanical forces which may damage or otherwise affect them.

Conventional access doors or panels are varied in structure, but frequently include substantial mechanical components, such as elaborate hinges, support struts, clasps, and the like. These parts are expensive, laborious to assemble, and add considerable extra weight.

Accordingly, it would be desirable to have an access door, especially adapted for a carryable case containing an electronic apparatus, such as photovoltaic cells, that avoids these shortcomings. The access panel disclosed herein is simple in construction, and inexpensive to manufacture, while providing protection of electronic utilities (e.g., electrical sockets, ports, switches, and the like) mounted on the case exterior from moisture and debris.

The preceding information is presented as background information only to assist with an understanding of the present disclosure. No determination has been made, and no assertion is made, as to whether any of the above might be applicable as prior art with regard to the present disclosure. The implementations and application of the innovations described herein are defined by the appended claims.

BRIEF SUMMARY

The present disclosure provides a magnetic access panel for use with a carrying case having a case housing and containing an electronic apparatus. In one implementation, the magnetic access panel may comprise a substantially planar body having a first side and a second side, and a first end and a second end, and a pivotable coupling configured to attach the first end of the planar body to a surface of the case housing. The first and second sides of the planar body may be configured to be magnetically affixed to the surface of the case housing. In some implementations, the planar body may further include one or more permanent magnets. In some implementations, the permanent magnets may be disposed within the planar body. In some implementations, the access panel may be made of a flexible, pliable rubber-like material, configured to form a water-tight seal when abutting a surface. In some implementations, the access panel may be made of a hinged ridged resin. In some implementations, the planar body may further include at least one of one or more finger slots and one or more pull tabs, configured to assist lifting of the access panel. In some implementations, the pivotable coupling may comprise a living hinge.

The present disclosure also provides a carrying case containing an electronic apparatus. In one implementation, the carrying case may comprise a case housing defining a surface and at least one recessed area defined therein, and a magnetic access panel comprising a substantially planar body having a first side and a second side, and a first end and a second end, and a pivotable coupling configured to attach the first end of the planar body to the surface of the case housing. The first and second sides of the planar body of the access panel may be configured to be magnetically affixed to the surface of the case housing. In some implementations, the access panel may further include one or more permanent magnets. In some implementations, the permanent magnets may be disposed within the planar body of the access panel. In some implementations, the case housing may include one or more permanent magnets. In some implementations, the planar body of the access panel may be configured to be secured inside the recessed area of the case housing via magnetic attraction. In some implementations, the planar body of the access panel may be further configured to be secured inside the recessed area of the case housing via a frictional fit. In some implementations, the case housing may define two recessed areas comprising a storage inset and a utility inset, and wherein the access panel is configured to be pivotable between and magnetically secured within the storage inset and the utility inset. In some implementations, the access panel may be made of a flexible, pliable rubber-like material, configured to form a water-tight seal when abutting a surface. In some implementations, the recessed area of the case housing may include a utility cluster, and the access panel may be debossed to correspond to a surface relief profile of the utility cluster. In some implementations, the access panel may be made of a hinged ridged resin. In some implementations, at least one of the planar body of the access panel and the case housing may include one or more finger slots configured to assist lifting of the access panel. In some implementations, the pivotable coupling may comprise a living hinge. In some implementations, one portion of the pivotable coupling may be configured to be molded into the case housing and another portion of the pivotable coupling may be configured to be molded into the planar body of the access panel.

These and other features, aspects, and advantages of the disclosure will be apparent from a reading of the following detailed description together with the accompanying drawings, which are briefly described below.

BRIEF DESCRIPTION OF THE DRAWINGS

The present disclosure is illustrated by way of example and not limitation in the figures of the accompanying drawings, in which like references indicate similar elements and wherein:

FIG. 2A is an elevated perspective side view of a magnetic access panel shown in relation to an illustrative carrying case in accordance with at least some example implementations of the present disclosure;

FIG. 2B is an elevated perspective side view of a magnetic access panel shown in relation to an illustrative carrying case in accordance with at least some example implementations of the present disclosure;

FIG. 2C is an elevated perspective side view of a magnetic access panel shown in relation to an illustrative carrying case in accordance with at least some example implementations of the present disclosure;

FIG. 3A is a cross sectional view taken along the line 2-2 in accordance with at least some example implementations of the present disclosure;

FIG. 3B is a cross sectional view taken along the line 2-2 in accordance with at least some example implementations of the present disclosure;

DETAILED DESCRIPTION

So that the example implementations presented herein may be readily understood, certain terms are first defined. It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

In the following detailed description, references are made to the accompanying drawings, which form a part of the description and in which are shown, by way of illustration, specific example implementations of the present disclosure. Although these example implementations are described in sufficient detail to enable one skilled in the art to practice the described example implementations, it is understood that these examples are not limiting, such that other example implementations may be used and changes may be made without departing from the spirit and scope of the described example implementations.

Figure 1:
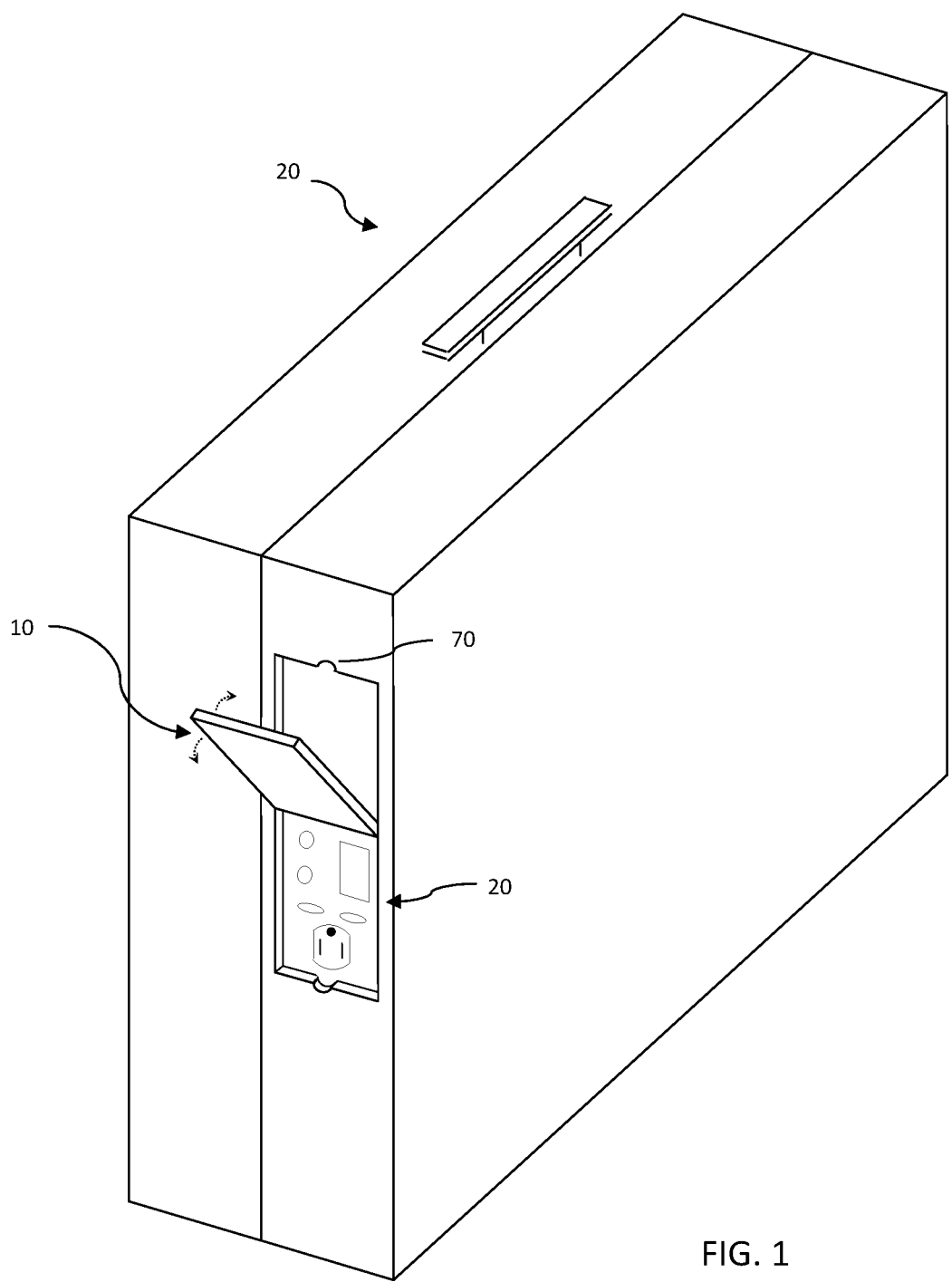
FIG. 1 is an elevated perspective side view of a magnetic access panel shown in relation to an illustrative carrying case in accordance with at least some example implementations of the present disclosure.

Referring now in greater detail to the drawing figures appended hereto, wherein the present disclosure is directed to a magnetic access panel adapted for permitting access to features either on the surface of or in the interior of an enclosure housing, especially an enclosure for electronic components. Addressing first the function and operation of the access panel, in FIGS. 1-4 is shown a magnetic access panel, according to an example implementation, depicting its general external features and shown, for environmental purposes only, in relation to an illustrative carryable case. According to the present inventive concept, in FIG. 1 is shown an example implementation of a magnetic access panel 10 in relation to a representative electronic utility cluster 25 (collection of electronic services, such as controls, ports, sockets, connections, and the like) on the exterior surface of a case housing 15. In general, the access panel 10 takes the form, in this example implementation, of a one-piece, substantially rectangular planar body, pivotally coupled at one edge to the case housing 15, such that the panel 10 is capable of swinging through at least approximately 180°, allowing either of opposite sides of the panel 10 to lie flat against the case housing 15. It should be recognized that the access panel 10 can be varied in shape and relative dimensions from those contemplated in the present disclosure.

In FIGS. 2A-2C, the example access panel 10 is further presented in relation to an illustrative carrying case 20, and depicting the access panel 10 in a series of positions, relative to the case housing 15. It will be observed that the case housing 15, in this example, includes a recessed area 30 defining a space which can receive the access panel 10 when the panel 10 resides flush against the case housing 15. In FIG. 2A, the access panel 10 is shown disposed over the utility cluster 25, in which position the panel 10 may be stored when the utilities are not in active use. In this position, the panel 10 overlays the utilities, shielding them from moisture, dust, and debris, as well as accidental contact from external force, which might damage the utilities or inadvertently alter their desired settings. In the example implementation shown, the panel 10 is received into a recessed space 30 in the case housing 15, such that the outer surface of the panel 10 is flush with the housing surface. This arrangement allows the panel 10 to be stored unobtrusively, where it can escape impact which may jar it loose.

Figure 4:
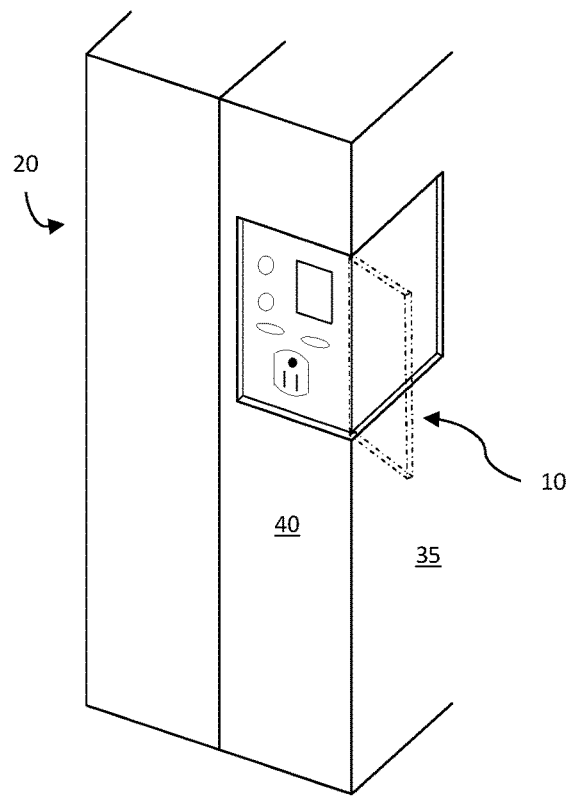
FIG. 4 is an elevated perspective side view of a magnetic access panel shown in relation to an illustrative carrying case in accordance with at least some example implementations of the present disclosure.
Figure 5:
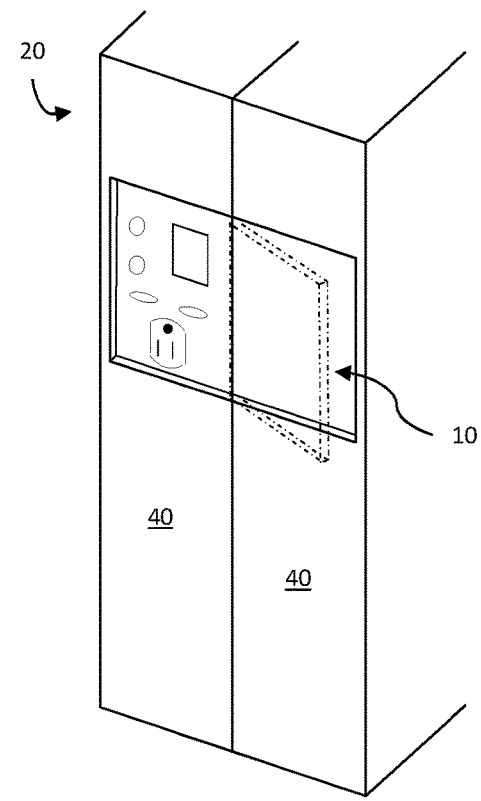
FIG. 5 is an elevated perspective side view of a magnetic access panel shown in relation to an illustrative carrying case in accordance with at least some example implementations of the present disclosure.
Figure 6:
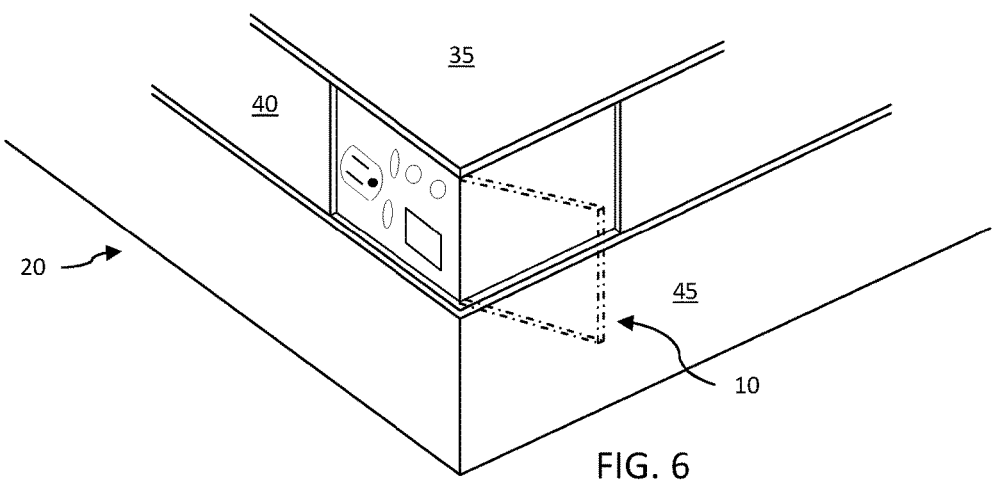
FIG. 6 is an elevated perspective side view of a magnetic access panel shown in relation to an illustrative carrying case in accordance with at least some example implementations of the present disclosure.

In FIGS. 4-6 are presented suggested alternative example implementations, among others, of disposing an access panel 10 on a representative carrying case 20. In FIG. 4 is shown an access panel 10 mounted on an edge of the carrying case 20, such that the panel 10 pivots from a side panel 35 to an end panel 40 of the case. In such a manner, the access panel 10 of this implementation may be capable of swinging through at least approximately 270°. In FIG. 5 is shown an access panel 10 disposed on an end panel 40, such that the panel 10 pivots from one end panel 40 to the opposing end panel 40. In such a manner, the access panel 10 of this implementation may be capable of swinging through at least approximately 180°. In this configuration, the access panel 10 may also act as a magnetic closure to secure the opposite halves of the case together. In FIG. 6 is shown an access panel 10 mounted to an edge of the carrying case, such that the panel pivots from a top panel 45 to an adjacent end panel 40. In such a manner, the access panel 10 of this implementation may be capable of swinging through at least approximately 270°.

In accordance with the present inventive concept, the access panel can be equipped with one or more suitably disposed permanent magnets, whereby it may adhere securely to the case housing when the panel overlays the housing. In an example implementation, the panel magnets fasten to the case housing where the housing is made of a magnetically attracting metal. In another example implementation, where the case housing is constructed of a non-magnetically attractive material (e.g., including, but not limited to, thermoplastics, aluminum), the panel magnets may engage with corresponding magnets disposed in or on the case housing. When the access panel is used in conjunction with a case or enclosure housing electronic apparatus, it is especially important to prevent water from entering the housing where it may harm or impair electronic implements. Ideally, the magnetic attraction is strong enough that it not only prevents the panel from inadvertently dropping away from the case housing, but also beneficially pulls the panel firmly against the utility features, thereby forming a water-tight seal to effectively seal out moisture and dust. In an example implementation, the panel may be made of a flexible, semi-pliant, elastomeric material which can form a water-tight gasket. In an example implementation, the panel may be debossed to correspond to the surface relief profile of the utility cluster, in order to achieve a more effective seal. In principle, any permanent magnets may be used for this purpose; however, in an example implementation, the magnets may be of the rare-earth type to assure that the panel is retained securely. In addition to magnets, the access panel may be further secured frictionally by fashioning the panel of dimensions and structure such that a tight fit is produced between the panel and the case housing.

In FIG. 2B is shown the access panel 10 in a transitional position, lifted away from the case housing 15 and residing between the utility cluster 25 and the opposing panel storage inset 60. In order to assist in this operation, certain means may be used, such as a finger slot 70 (see FIG. 1), whereby the operator may insert one or more fingers at the edge of the access panel 10 and disengage it from the case housing 15. In the example implementation presented, the finger slot is integral with the case housing; in other example implementations, one or more finger slots may be added to the access panel, or corresponding finger slots may be included on both the panel and the case housing. In yet another alternative example implementation, the access panel may feature one or more pull tabs.

In FIG. 2C is shown the access panel 10 residing in the storage inset 60 opposite the utility cluster inset 65. When the utility cluster 25 must be accessed for active use, such as when electrical cables or other connections are in use, the access panel 10 may be disposed in this position in order to stow it in an unobtrusive manner where it will not interfere with use of the utilities or be damaged by external force. The panel 10 may be secured in the storage inset 60 in the same fashion as in the utility inset 65. As discussed, supra, in an example implementation, magnets may be employed to hold the panel 10 against the case housing 15; however, the magnetic force required to secure the panel 10 in the storage inset 60 need not be as great as that used for the utility inset 65, as restricting water and dust from the storage inset is not as essential. Thus, less expensive ferrite (i.e., ceramic) magnets or mild steel may be used for this application.

Considering now the construction of the disclosed magnetic access panel in more detail according to the present inventive concept, the panel may be made of a variety of materials that are preferably water-proof, durable, and inexpensive. In an example implementation, the panel body is formed of a flexible, somewhat pliable, elastomeric or rubber-like material that retains its physical attributes after prolonged exposure to heat, cold, sun, moisture, and repeated flexing. Such material candidates include thermoplastic elastomers (TPE) and synthetic rubbers (e.g., including, but not restricted to, neoprene). These materials are inexpensive, light-weight, demonstrate a prolonged flexing cycle life, and can readily be custom-molded to the desired shape. Alternatively, a hinged ridged resin, like polycarbonate, can be used to form the access panel. A gasketed perimeter seal on the enclosure is pressed sealed when the door closes. The magnets are part of the sealing mechanism that uses magnetic force to hold the door closed and sealed against the gasket.

In FIGS. 3A-3B is presented an example implementation of a magnetic access panel showing its structure and operation. FIG. 3A is a cross sectional view of an access panel 10 along the line indicated in FIG. 2C, showing its external profile and internal structure. In this example, the panel 10 is a substantially unitarily-cast planar body. The end of the panel 10 proximate to the case housing 15 exhibits molded means allowing the panel 10 to be attached to the housing 15 and provide a longitudinal live (or flexible) hinge whereon the panel may pivot. In order to secure the panel 10 to the housing 15, a rounded mounting nub 75 may engage the case housing 15 by simply pressing it into a retaining channel 85. Opposing beveled portions 80 adjacent to the mounting nub 75 form a flexing zone therebetween which resides above the case housing 15 after the panel 10 is mounted to the housing 15. As shown in FIG. 3B, a living hinge 90, in cooperation with the beveled portions 80, permits the access panel 10 to pivot toward the case housing 15 until it abuts the housing 15 in the panel receiving inset 30. Other means may be contemplated for hingedly joining the access panel to the case housing. Alternately the hinge body may also be molded into the enclosure and the access door requiring only a pin to hold it in place eliminating the metal hinge assembly.

In accordance with the present inventive concept, the sample access panel presented in FIGS. 3A-3B also incorporates means for magnetically securing the panel in the receiving inset. In this example implementation, one or more magnets 50 are disposed within the panel body where they may be embedded during the panel fabrication process. Alternatively, magnets may be mounted on the exterior surface of the panel. When the case housing 15 is constructed of nonmagnetically attractive material, corresponding magnets 55 may be disposed on the case housing surface, as shown in FIGS. 3A-3B, in order to magnetically attract the panel magnets 50. The magnets associated with both the access panel 10 and the case housing 15 may be suitably positioned in a variety of locations in order to achieve maximum effectiveness and to avoid interfering with other case components. In another example implementation, the access panel is made, at least partially, of a magnetically attractive metal and coated with a pliable rubber-like compound. Such an access panel is magnetically attracted to one or more magnets disposed on the case housing. The magnet can also be nested in the access door with the corresponding metal receivers in the enclosure positioned appropriately in both the open and closed position. This eliminates the amount of magnets needed.

From the foregoing description it will be appreciated that the various example implementations disclosed herein provide a magnetic access panel that has a simple, unitary design with no mechanical parts, is inexpensively manufactured, and readily assembled, easy and reliable to operate, and light-weight. Further, the inventive aspects include a magnetic access panel specially adapted to seal and protect electronic components against moisture, dust, and damaging mechanical impact.

While various example implementations have been described above, it should be understood that they have been presented by way of example only, and not limitation. It will be apparent to persons skilled in the relevant art that various changes in form and detail can be made therein without departing from the spirit and scope of the example implementations. Thus, the breadth and scope of the example implementations should not be limited by any of the above-described example implementations, but should be defined only in accordance with the following claims and their equivalents.

What is claimed is:

1. A magnetic access panel for use with a carrying case having a case housing and containing an electronic apparatus, said magnetic access panel comprising:
 a substantially planar body having a first side and a second side, and a first end and a second end; and
 a pivotable coupling configured to attach the first end of the planar body to a surface of the case housing, wherein the first and second sides of the planar body are configured to be magnetically affixed to the surface of the case housing, and wherein the planar body is configured to be pivotable between and magnetically secured within a first recessed area of the carrying case and a second recessed area of the carrying case.

2. The magnetic access panel of claim 1, wherein the planar body further includes one or more permanent magnets.

3. The magnetic access panel of claim 2, wherein the permanent magnets are disposed within the planar body.

4. The magnetic access panel of claim 1, wherein the access panel is made of a flexible, pliable rubber-like material, configured to form a water-tight seal when abutting a surface.

5. The magnetic access panel of claim 1, wherein the access panel is made of a hinged ridged resin.

6. The magnetic access panel of claim 1, wherein the planar body further includes at least one of one or more finger slots and one or more pull tabs, configured to assist lifting of the access panel.

7. The magnetic access panel of claim 1, wherein the pivotable coupling comprises a living hinge.

8. A carrying case containing an electronic apparatus, said carrying case comprising:
a case housing defining a surface and at least one recessed area defined therein; and
a magnetic access panel comprising:
a substantially planar body having a first side and a second side, and a first end and a second end, and
a pivotable coupling configured to attach the first end of the planar body to the surface of the case housing,
wherein the first and second sides of the planar body of the access panel are configured to be magnetically affixed to the surface of the case housing, wherein the case housing defines two recessed areas comprising a storage inset and a utility inset, and wherein the access panel is configured to be pivotable between and magnetically secured within the storage inset and the utility inset.

9. The carrying case of claim 8, wherein the access panel further includes one or more permanent magnets.

10. The carrying case of claim 9, wherein the permanent magnets are disposed within the planar body of the access panel.

11. The carrying case of claim 9, wherein the case housing includes one or more permanent magnets.

12. The carrying case of claim 11, wherein the planar body of the access panel is further configured to be secured inside the recessed area of the case housing via a frictional fit.

13. The carrying case of claim 8, wherein the planar body of the access panel is configured to be secured inside the recessed area of the case housing via magnetic attraction.

14. The carrying case of claim 8, wherein the access panel is made of a flexible, pliable rubber-like material, configured to form a water-tight seal when abutting a surface.

15. The carrying case of claim 8, wherein the recessed area of the case housing includes a utility cluster, and wherein the access panel is debossed to correspond to a surface relief profile of the utility cluster.

16. The carrying case of claim 8, wherein the access panel is made of a hinged ridged resin.

17. The carrying case of claim 8, wherein at least one of the planar body of the access panel and the case housing includes one or more finger slots configured to assist lifting of the access panel.

18. The carrying case of claim 8, wherein the pivotable coupling comprises a living hinge.

19. The carrying case of claim 8, wherein one portion of the pivotable coupling is configured to be molded into the case housing and another portion of the pivotable coupling is configured to be molded into the planar body of the access panel.

* * * * *